United States Patent [19]

Teszner et al.

[11] 3,767,982

[45] Oct. 23, 1973

[54] ION IMPLANTATION FIELD-EFFECT SEMICONDUCTOR DEVICES

[76] Inventors: Stanislas Teszner, 49 Rue de la Tour, Paris; Daniel P. Lecrosnier, La Clarte; Gerard P. Pelous, 18 Rue des Bons Enfants, both of Perros-Euirec, Paris, all of France

[22] Filed: Aug. 4, 1972

[21] Appl. No.: 277,878

[30] Foreign Application Priority Data

Aug. 5, 1971 France .............................. 7128793

[52] U.S. Cl.... 317/235 R, 317/235 A, 317/235 AY

[51] Int. Cl. ............................................. H01l 11/00

[58] Field of Search....................... 317/235, 21, 48.9

[56] References Cited

UNITED STATES PATENTS

| | | | |
|---|---|---|---|
| 3,431,150 | 3/1969 | Dolan et al. | 148/1.5 |
| 3,381,187 | 4/1968 | Zuleeg | 317/235 |
| 3,558,366 | 1/1971 | Lepselter | 148/1.5 |
| 3,465,216 | 9/1969 | Teszner | 317/235 |
| 3,497,777 | 2/1970 | Teszner | 317/235 |

*Primary Examiner*—John W. Huckert
*Assistant Examiner*—E. Wojciechowicz
*Attorney*—Abraham A. Saffitz

[57] ABSTRACT

Field-effect semiconductor device comprising a wafer of semi-conductor material of one type of conductivity, a drain electrode on one surface of said wafer, an implantation metal mask on the other surface thereof, said mask having solid zones and openings, and a plurality of conducting channels perpendicular to said drain electrode and mask and positioned beneath the mask solid zones. A buried gate region is devised by implantation of doping ions of opposite type of conductivity to wafer conductivity and a buried insulating region adjacent to said gate region is devised by implantation of non-doping ions. A diffused region of the opposite type of conductivity to wafer conductivity extends to the implanted gate region. The implantation mask has two separate parts, the first covering the diffused region and serving as the gate electrode and the second covering the conducting channel positions and serving as the source electrode.

3 Claims, 11 Drawing Figures

ION IMPLANTATION FIELD-EFFECT SEMICONDUCTOR DEVICES

This invention relates to field-effect devices of the kind commonly known as gridistors and comprising a number of parallel conductive channels of one type of conductivity connecting a source electrode to a drain electrode of the same type of conductivity and surrounded by a unitary grid of the opposite type of conductivity. More particularly, the invention relates to gridistors constructed by the ion implantation technique.

Gridistor structures have already been described, inter alia, in U.S. Pat. 3,274,461 and 3,497,777 respectively issued on Sept. 20, 1966 and Feb. 24, 1970 to the present applicant.

In conventional gridistors where the gate body is formed by diffusion followed by an epitaxial growth for burying the gate and the gate contact is obtained by causing diffusion from a superficial contact zone into the gate body, it is known that the structure of the gate originally formed by diffusion undergoes three alterations, one during epitaxial growth, the second during formation of the oxide mask designed for forming the frame for making internal gate contact and the third during diffusion of this inner gate contact frame.

It has been proposed to directly bury the gate by ion implantation in the semiconductor material which permits to spare the epitaxial growth step following the diffusion of the gate and to prevent the extension of the gate resulting thereto. It is known that the ion implantation technique consists in bombarding with doping or non-doping ions having energies comprised between several tens or several hundreds of keV a semiconductor substrate. In this way an impurity concentration space pattern is obtained having the shape of a gaussian distribution curve with a peak at a distance beneath the substrate surface depending on the bombardment energy. Unlike the diffusion technique in which the maximum of the impurity concentration pattern lies on the substrate surface, it is possible with the implantation technique to obtain impurity concentration peaks lying between several micron tenths and several microns from the surface level. Implantation is carried out through a metal mask coating the semiconductor wafer and having solid parts preventing the conducting channel regions from being doped to the type of conductivity opposite that of the wafer. In the proposed process, the metal mask is removed with acid or other appropriate material for subsequently heating the gridistor in an oven to enneal radiation damage and to provide the activation energy necessary to place the majority of the implanted ions on lattice sites and then forming the frame making internal gate contact.

It is also known that the number of channels per unit area of a gridistor is mainly limited by the resistivity of the gate region which must be relatively low. For this, the gate region must be heavily doped and it results therefrom many defects in the semiconductor crystal in the region between the implanted buried gate and the surface. The gate is thus poorly insulated from the metal electrode on the surface of the wafer.

In fact the implantation technique permits to implant non-doping ions as well as doping ions, for example O, N, C ions which increase the resistivity of the semiconductor material. In this way, resistivities as large as $10^4$ ohm.cms can be obtained.

The object of the invention is to provide field-effect semi-conductor devices of the gridistor type with a heavily doped implanted gate region surmounted by an adjacent semi-insulator implanted region.

Another object of the invention is to provide field-effect semiconductor devices of the gridistor type in which the mask through which the implantation is worked out simultaneously serves as gate electrode and as one of the source and drain electrodes thereby dispensing from the step of positively forming these electrodes. It results therefrom that from the instant of implanting the gate and the region between said gate and the surface, no process of epitaxial growth, semiconductor osidation or diffusion takes place which would give rise to an alteration of the gate structure.

The invention will now be described in detail with reference to the accompanying drawings wherein :

FIG. 1 is a partial transverse cross-sectional view of a field effect transistor according to the invention;

FIGS. 2*a*, 2*b*, and 2*c* are plan views for consecutive stages in the manufacture by volume implantation of ions in a single compartment device;

FIGS. 3*a* and 3*b* are plan views of two alternative forms of structure;

FIGS. 4*a* and 4*b* are plan views of structures comprising two juxtaposed compartments and deriving from the structures shown in FIGS. 3*a* and 3*b* respectively;

Figure 1:
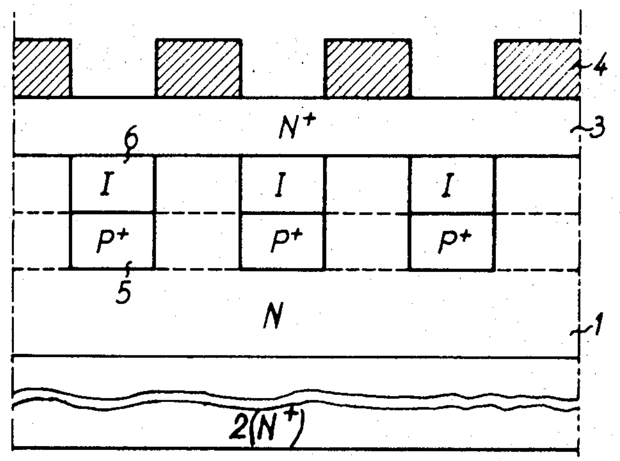

FIG. 1 is a view in section of a substrate 1 of N type silicon with two heavily doped $N^+$ layers 2, 3 on either side of the substrate, layer 2 providing ohmic contact for the drain electrode and layer 3 providing ohmic contact with the bars or pellets of a mask 4. This mask comprises metallic layers disposed one above another, for instance, (Pt, Mo, Au) or (Cr, Al, Au) or (Mo, Au) the first of such layers Pt or Cr or Mo, being contiguous with the $N^+$ layer 3. A $P^+$ grid 5 is formed by ion implantation, for instance, by the implantation of boron ions, and an insulating zone I, 6, is produced by a second implantation of argon or oxygen or nitrogen or carbon ions. The drain electrode is disposed on the layer 2 and the source electrode is embodied by the mask 4; if required, the drain and the source can be changed round. The gate electrode too is formed by some portion of the mask 4, as will be described hereinafter.

Figure 2A:
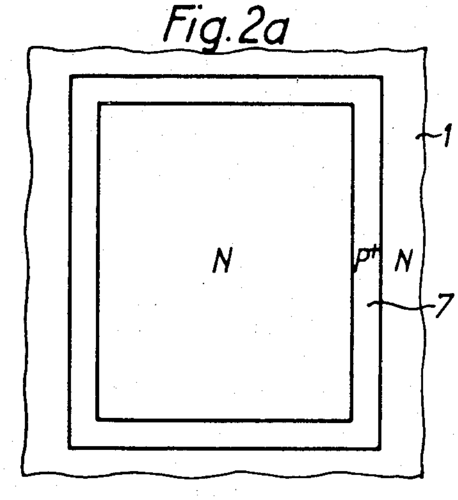
Figure 2B:
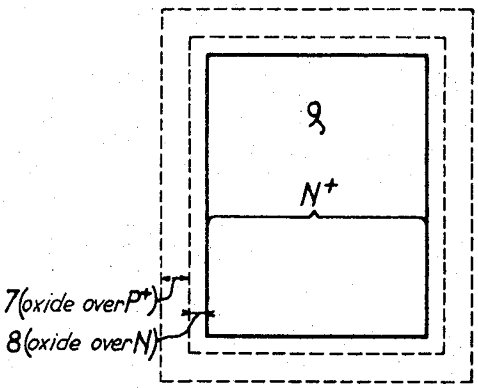
Figure 2C:
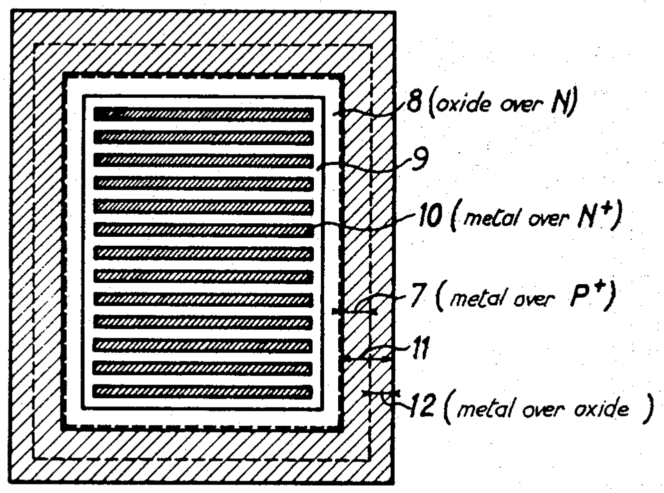

The stages in the manufacture of a gridistor according to the invention and the structure of such gridistor will be described first with reference to FIGS. 2*a*, 2*b* and 2*c*. In a first stage, a $P^+$ frame 7 which can be rectangular or of any appropriate shape is selectively diffused into an N type silicon substrate 1 of a resistivity of about 1 ohm.cm through an oxide mask (FIG. 2*a*), whereafter a heavily doped $N^+$ zone 9 (FIG. 2*b*), corresponding to the region 3 of FIG. 1, is diffused through another oxide mask which covers the frame 7 and a strip 8 parallel to and inside the same, whereafter the oxide layer covering the frame 7 is removed but left outside the frame and in the region 8 (FIG. 2*c*) and the whole surface of the wafer is covered by a metal mask formed by consecutive evaporations in vacuo of the groups of metal of which three examples have just been given. For example, a 2,000 A thick molybdenum layer is deposited onto the whole surface of the wafer by cathodic sputtering, whereafter a gold layer 9,000 A thick is sputtered onto the preceding layer.

The mask is then treated by photogravure to reduce it to the bars 10 of FIG. 2$c$, corresponding to the regions 4 in FIG. 1, and to a frame 11 which rests on the $P^+$ frame 7 and on the oxide layer 12 outside the same.

Boron ions are then implanted through the mask openings with an energy of 1 MeV and a concentration of $10^{15}$ ions per $cm^2$, followed by the implantation of ions which make the substrate substantially an insulant locally and which are inter alia ions of Ar or O or N or C. This double implant leads to the formation of a buried $P^+$ gate 5 (FIG. 1). In the zone 8 the implanted gate is in contact with the $P^+$ frame 7 formed in the first step. Since the metal frame 11 is in contact with the frame 7 and the latter is in contact with the gate, the gate connection can be made to the frame 11.

In this structure one of the terminal electrodes (source or drain) is embodied by the metal bars 10 which are joined together either by a contact wire welded by thermocompression or by filling of the between-bars spaces by vacuum evaporation of a metal, such as gold, or of a metal alloy. The gate electrode is formed by the metal frame 11 of the ion implanting mask, as previously mentioned.

In this first structure, which has the advantage of being very simple to make, the surface utilization factor is satisfactory and the gate resistance is low, since the gate contact is formed by the frame 11 which, through frame 7, is in contact with the gate at the two ends of the spaces between the bars 10. But the source contact with the bars 10 may be unsatisfactory.

Figure 3A:
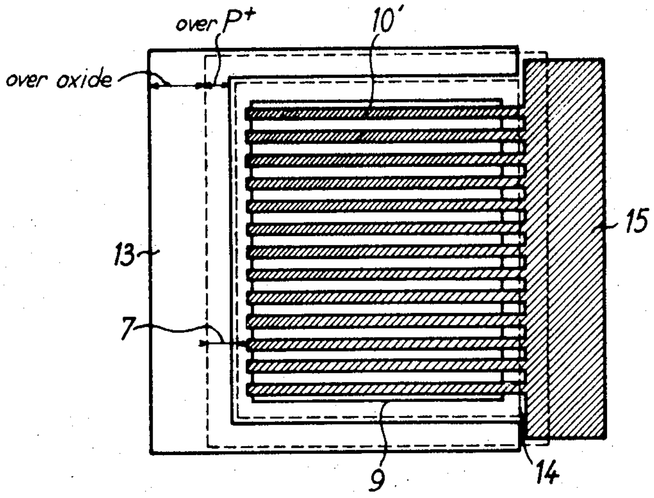
Figure 3B:
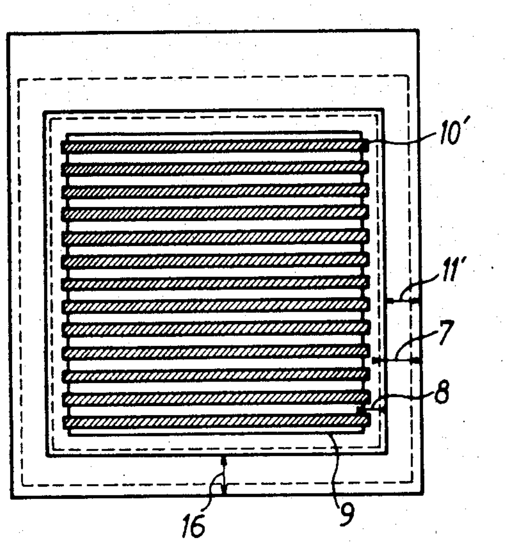

The structure shown in FIG. 3$a$ obviates this disadvantage; the metal frame 11 of FIG. 2$c$ is replaced by a metal frame 13 having three sides only lying partly on the $P^+$ region 7, partly on the oxide region 12. The fourth side of frame 7 is given neither a $P^+$ diffusion nor being metallized; at least, if it is metallized the metallizing is removed by photogravure. The bars 10' are extended above the oxide layer 8 beyond the fourth side 14 of frame 7 and interconnected at one of their ends by a metal bar or layer 15. Also, since the bars 10' extend beyond the boundary of zone 9 and overlap onto the oxide layer 8, the surface utilization factor is still further improved. Gate contact is taken on frame 13 of the U-shaped mask; gate resistance is therefore increased since the U-shaped gate contact 13 outcrops at only one end of the spaces between the bars 10'.

The embodiment shown in FIG. 3$b$ obviates this disadvantage; in this embodiment the bars 10' always extend to the oxide layer 8 and contact with the gate is by way of the metal frame 11', which is flush with both ends of the spaces between the bars 10'. This embodiment retains the advantage of improved surface utilization but loses the advantage of ease of contact with the bars, whose formation has the same disadvantages as in the structure of FIG. 2$c$.

All the structures so far discussed which form a single compartment can be enlarged to form multiple compartment structures. An extension of this kind is shown in FIGS. 4$a$ and 4$b$, being limited in this case to two compartments; in theory, however, the idea can be extended up to any number of compartments.

Figure 4A:
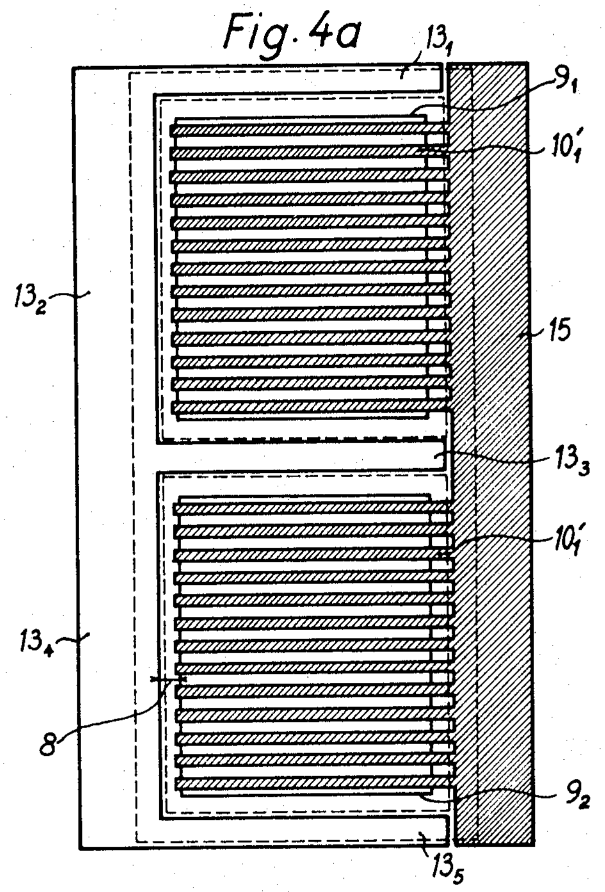
Figure 4B:
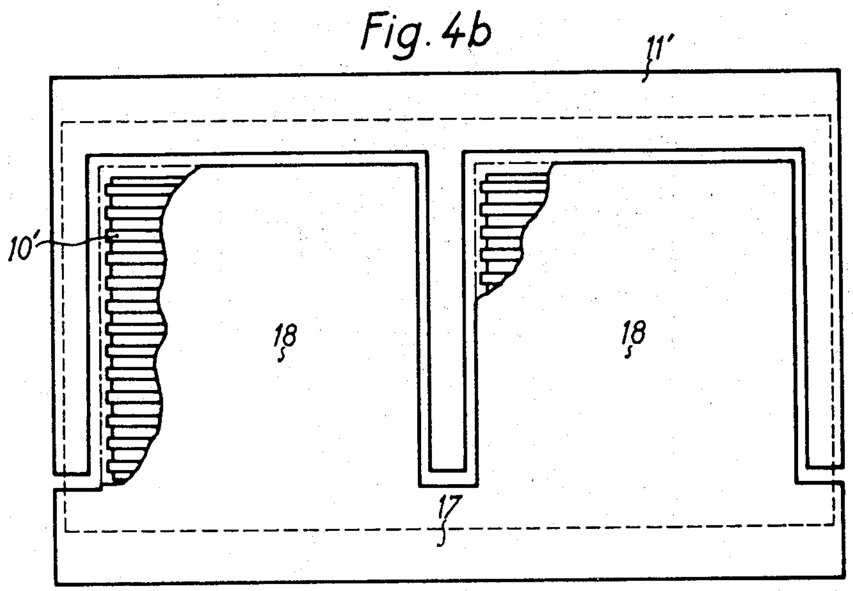

The structure shown in FIG. 4$a$ results from a simple juxtaposition of two single compartment structures shown in FIG. 3$a$. The two frames 11 of FIG. 2$c$ each have three sides $13_1$, $13_2$ and $13_3$ and $13_3$, $13_4$ and $13_5$. The two frames have one common side $13_3$ and two aligned sides $13_2$, $13_4$. The frame sides are disposed on both $P^+$ and oxide regions. The metal zone 15, which lies over the oxide region, interconnects the ends of the bars $10_1'$ of the mask on the $N^+$ heavily doped zone $9_1$ of the first compartment and the ends of the bars $10_2'$ of the mask on the $N^+$ heavily doped zone $9_2$ of the second compartment.

On the other hand, some changes had to be made to devise the structure of FIG. 4$b$ from the single compartment device of FIG. 3$b$. In FIG. 4$b$ the side 16 of the frame 11 (FIG. 3$b$) is omitted. A metal zone 17 is added to the bottom bar 10'. The spaces between bars 10' are filled by a metal layer produced by vacuum evaporation, for instance, of gold, to form the continuous zones 18 in FIG. 4$b$. To compensate for these changes, the structure has the advantages of very good surface utilization and therefore a very great reduction of stray capacitance, parallel with a very great reduction of gate resistance.

However, the capacitance introduced by the peripheral frame 11 (FIGS. 2$c$, 3$b$ and 4$b$) or 13 (FIG. 3$a$) is a nuisance in small structures. Advantageously, therefore, in small structures contacting is arranged at the center, in the manner shown in FIG. 5, which is a plan view of the structure, and in FIG. 6, which is a section in elevation.

Figure 5:
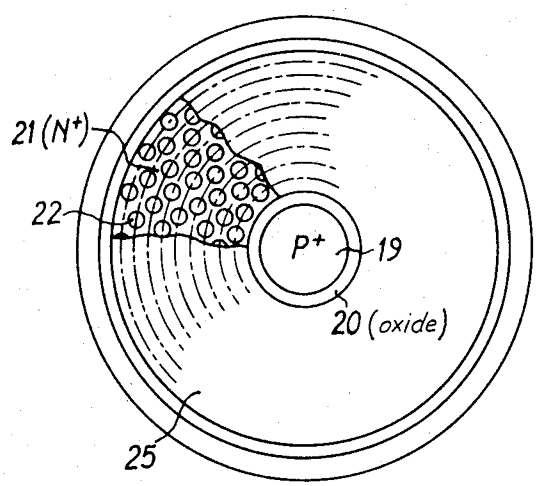
FIG. 5 is a plan view of a ministructure having cylindrical conducting channels and a central gate contact electrode.
Figure 6:
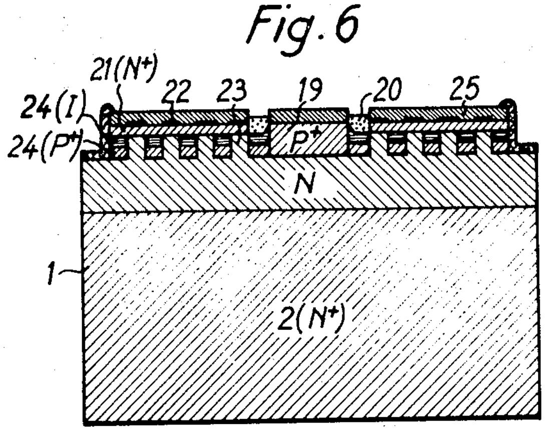
FIG. 6 is a view in elevation of the structure shown in FIG. 5.

In FIGS. 5 and 6 the central zone 19 is a $P^+$ layer which is diffused in the first manufacturing step and subsequently metallized, like the frame 11 or 11' of the previous examples. The central zone 19 is the gate contact. Extending therearound is an oxide-covered zone 20 and a diffused $N^+$ layer 21 which have the same functions as the frame 8 and zone 9 respectively of FIG. 2$b$. Metal circular discs 22 which have the same function as the bars 10 or 10' are deposited on the layer 21; as stated previously about the bars 10 or 10', the discs 22 form together with the disc 19 the gate ion implantation mask. Channels 23 are formed below the discs 22, and the gate 24 (24 $P^+$ and 24 I as in FIG. 1) is formed in the space between the discs 22. The same are then joined together, as previously described, by evaporation of a metal or metal alloy, to form a metal layer 25 which forms the source (or drain) electrode.

Figure 7:
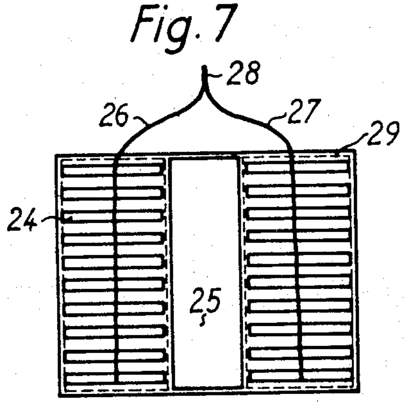
FIG. 7 is a plan view of a similar structure but with oblong-section channels.

FIG. 7 is a plan view of another structure which has rectangular-section channels as in FIGS. 2$a$, 2$b$, 2$c$ and 3$a$, 3$b$. There can be seen the channels 24 and a rectangular central zone 25, the latter dividing the structure virtually into two mini-compartments. As an example, the bars 24 of each mini-compartment are interconnected by wires 26, 27 thermocompression-welded to the bars, then welded together to form the source or drain lead-out 28. The chain lines denote a diffused $N^+$ zone 29 via which the substrate makes ohmic contact with the bars 24.

What we claim is:

1. A field-effect semiconductor device comprising of wafer of semiconductor material of one type of conductivity, a drain electrode on one surface of said wafer, an implantation conductive metal mask on the other surface thereof, said mask having solid zones in the form of parallel bars and a frome surrounding said bars and openings, a plurality of conducting channels perpendicular to said drain electrode and mask and positioned beneath the solid zones of the mask in the form of parallel bars, an implanted buried gate region formed through the mask opening by implantation of doping ions of the opposite type of conductivity to the wafer conductivity, an implanted buried insulating region between said gate region and said other surface and formed through the mask openings by implantation of non-doping ions which turn the semi-conductor material into a semi-insulator, a diffused region of the opposite type of conductivity to the wafer conductivity, located under the frame of the mask and extending to the implanted buried gate region, said implantation mask having two separate parts, a gate electrode part covering said diffused region in the form of a frame and a source electrode part covering the conducting channels in the form of parallel bars.

2. A field-effect semiconductor devide comprising a wafer of semiconductor material of one type of conductivity, a drain electrode on one surface of said wafer, an implantation conductive metal mask on the other surface thereof, said mask having solid zones in the form of a central portion and discrete discs surrounding said central portion and openings, a plurality of conducting channels perpendicular to said drain electrode and mask and positioned beneath the solid zones of the mask in the form of discrete discs, an implanted buried gate region formed through the mask openings by implantation of doping ions of the opposite type of conductivity to the wafer conductivity, an implanted buried insulating region between said gate region and said other surface and formed through the mask openings by implantation of non-doping ions which turn the semi-conductor material into a semi-insulator, a diffused region of the opposite type of conductivity to the wafer conductivity, located under the central portion of the mask and extending to the implanted buried gate region, said implantation mask having two separate parts, a gate electrode part covering said diffused region under said central portion and a source electrode part covering the conducting channels in the form of discrete discs.

3. A field-effect semiconductor device comprising a wafer of semiconductor material of one type of conductivity, a drain electrode on one surface of said wafer, an implantation conductive metal mask on the other surface thereof, said mask having openings and solid zones in the form of parallel bars and an incomplete three side frame, a plurality of conducting channels perpendicular to said drain electrode and mask and positioned beneath the solid zones of the mask in the form of parallel bars, an implanted buried gate region formed through the mask openings by implantation of doping ions of the opposite type of conductivity to the wafer conductivity, an implanted buried insulating region between said gate region and said other surface and formed through the mask openings by implantation of non-doping ions which turn the semiconductor material into a seim-insulator, a diffused region of the opposite type of conductivity to the wafer conductivity, located under the incomplete three side frame of the mask and extending to the implanted buried gate region, said implantation mask having two separate parts, a gate electrode part covering said diffused region in the form of an incomplete three side frame and a source electrode part covering the conducting channels in the form of parallel bars and a general bar connecting therebetween the parallel bars.

* * * * *